(12) United States Patent
Seals

(10) Patent No.: US 9,982,332 B2
(45) Date of Patent: *May 29, 2018

(54) HARDFACE COATING SYSTEMS AND METHODS FOR METAL ALLOYS AND OTHER MATERIALS FOR WEAR AND CORROSION RESISTANT APPLICATIONS

(71) Applicant: Roland D. Seals, Oak Ridge, TN (US)

(72) Inventor: Roland D. Seals, Oak Ridge, TN (US)

(73) Assignee: Consolidated Nuclear Security, LLC, Oak Ridge, TN (US)

( * ) Notice: Subject to any disclaimer, the term of this patent is extended or adjusted under 35 U.S.C. 154(b) by 348 days.

This patent is subject to a terminal disclaimer.

(21) Appl. No.: 14/797,344

(22) Filed: Jul. 13, 2015

(65) Prior Publication Data

US 2015/0315693 A1 Nov. 5, 2015

Related U.S. Application Data

(63) Continuation-in-part of application No. 13/630,982, filed on Sep. 28, 2012, now Pat. No. 9,108,276, which
(Continued)

(51) Int. Cl.
| | |
|---|---|
| C23C 4/10 | (2016.01) |
| C23C 16/38 | (2006.01) |
| B23K 35/32 | (2006.01) |
| B23K 35/34 | (2006.01) |
| C01B 35/04 | (2006.01) |
| C23C 10/30 | (2006.01) |
| C23C 12/02 | (2006.01) |
| C23C 18/08 | (2006.01) |
| C23C 18/12 | (2006.01) |

(Continued)

(52) U.S. Cl.
CPC .............. *C23C 4/10* (2013.01); *B23K 35/325* (2013.01); *B23K 35/327* (2013.01); *B23K 35/34* (2013.01); *C01B 35/04* (2013.01); *C23C 4/067* (2016.01); *C23C 4/134* (2016.01); *C23C 10/30* (2013.01); *C23C 12/02* (2013.01); *C23C 16/38* (2013.01);
(Continued)

(58) Field of Classification Search
CPC .... B23K 35/325; B23K 35/327; B23K 35/34; C23C 4/127; C23C 4/067; C23C 4/10; C23C 4/12; C23C 4/134; C23C 10/30; C23C 12/10; C23C 16/38; C23C 18/08;
(Continued)

(56) References Cited

U.S. PATENT DOCUMENTS

| 4,072,864 A | 2/1978 | von Gutfeld et al. |
| 4,673,550 A | 6/1987 | Dallaire et al. |

(Continued)

*Primary Examiner* — Colleen P Dunn
*Assistant Examiner* — Anthony M Liang
(74) *Attorney, Agent, or Firm* — Clements Bernard Walker PLLC; Christopher L. Bernard

(57) ABSTRACT

The present disclosure relates generally to hardface coating systems and methods for metal alloys and other materials for wear and corrosion resistant applications. More specifically, the present disclosure relates to hardface coatings that include a network of titanium monoboride (TiB) needles or whiskers in a matrix, which are formed from titanium (Ti) and titanium diboride ($TiB_2$) precursors by reactions enabled by the inherent energy provided by the process heat associated with coating deposition and, optionally, coating post-heat treatment. These hardface coatings are pyrophoric, thereby generating further reaction energy internally, and may be applied in a functionally graded manner. The hardface coatings may be deposited in the presence of a number of fluxing agents, beta stabilizers, densification aids, diffusional aids, and multimode particle size distributions to further enhance their performance characteristics.

14 Claims, 4 Drawing Sheets

Related U.S. Application Data is a continuation-in-part of application No. 12/122,024, filed on May 16, 2008, now Pat. No. 8,691,343.

(51) Int. Cl.
    *C23C 4/134*     (2016.01)
    *C23C 24/08*     (2006.01)
    *C23C 4/067*     (2016.01)
    *C22F 1/18*     (2006.01)

(52) U.S. Cl.
    CPC .......... *C23C 18/08* (2013.01); *C23C 18/1204* (2013.01); *C23C 18/1241* (2013.01); *C23C 18/1275* (2013.01); *C23C 24/085* (2013.01); *C22F 1/183* (2013.01)

(58) Field of Classification Search
    CPC ............ C23C 18/1204; C23C 18/1275; C23C 24/085; C01B 35/04; C22F 1/183
    See application file for complete search history.

(56) References Cited

U.S. PATENT DOCUMENTS

| | | |
|---|---|---|
| 6,004,362 A | 12/1999 | Seals et al. |
| 6,923,946 B2 | 8/2005 | Geohegan et al. |
| 7,815,973 B2 | 10/2010 | Geohegan et al. |
| 2002/0102400 A1 | 8/2002 | Gorokhovsky et al. |
| 2003/0183529 A1 | 10/2003 | Ohara et al. |
| 2005/0208213 A1 | 9/2005 | Chandran et al. |
| 2005/0257864 A1 | 11/2005 | Marquardt et al. |
| 2006/0111005 A1 | 5/2006 | Geohegan et al. |
| 2008/0152890 A1 | 6/2008 | Friess et al. |
| 2009/0282949 A1 | 11/2009 | Seals et al. |

HARDFACE COATING SYSTEMS AND METHODS FOR METAL ALLOYS AND OTHER MATERIALS FOR WEAR AND CORROSION RESISTANT APPLICATIONS

CROSS-REFERENCE TO RELATED APPLICATION(S)

The present disclosure is a continuation-in-part (CIP) of co-pending U.S. patent application Ser. No. 13/630,982, filed on Sep. 28, 2012, which is a CIP of co-pending U.S. patent application Ser. No. 12/122,024, filed on May 16, 2008, the contents of which are incorporated in full by reference herein.

STATEMENT REGARDING FEDERALLY SPONSORED RESEARCH OR DEVELOPMENT

The U.S. Government has rights to the present disclosure pursuant to Contract No. DE-NA0001942 between the U.S. Department of Energy and Consolidated Nuclear Security, LLC.

FIELD OF THE DISCLOSURE

The present disclosure relates generally to hardface coating systems and methods for metal alloys and other materials for wear and corrosion resistant applications. More specifically, the present disclosure relates to hardface coatings that include a network of titanium monoboride (TiB) needles or whiskers in a matrix, which are formed from titanium (Ti) and titanium diboride (TiB$_2$) precursors by reactions enabled by the inherent energy provided by the process heat associated with coating deposition and, optionally, coating post-heat treatment. These hardface coatings are pyrophoric, thereby generating further reaction energy internally, and may be applied in a functionally graded manner. The hardface coatings may be deposited in the presence of a number of fluxing agents, beta stabilizers, densification aids, diffusional aids, and multimode particle size distributions to further enhance their performance characteristics.

BACKGROUND OF THE DISCLOSURE

Metal alloys, such as titanium alloys and steels, are known to have a good combination of mechanical properties for many structural applications, but these metal alloys do not meet the wear and corrosion resistance requirements for some structural applications, such as rotor blade applications, turbine blade applications, cutting tool applications, arc-heater applications, power generating surface applications, military hardware applications, sports industry equipment applications (e.g., golf club heads, shoe spikes, and snow skis), molten aluminum casting applications, and the like. Titanium alloys, for example, have many attractive properties, such as high specific strength and stiffness, relatively low density, and excellent corrosion resistance, but have poor resistance to wear and oxidation at high temperatures. Conventional surfacing (such as nitriding), coating deposition (such as plasma spraying and sputtering), and plating have significant shortcomings, which include potentially providing distorted substrates, deteriorated surfaces, and/or weak interfacial bonding. To overcome these shortcomings and provide high wear and corrosion resistant surfaces on metal alloy substrates, surface alloying and reactive surface modification have been developed—depositing and post-heat treating a unique combination of materials, selected based upon the substrate material and specific application environment. Functionally graded or layered interfaces are used to overcome interfacial bonding weaknesses, especially when the coefficient of thermal expansion (CTE) is significantly different between the substrate and a ceramic or cermet surface coating.

However, what are still needed in the art are hardface coating systems and methods for metal alloys and other materials for wear and corrosion resistant applications that overcome some of these attendant shortcomings.

BRIEF SUMMARY OF THE DISCLOSURE

In various exemplary embodiments, the present disclosure provides hardface coating systems and methods for metal alloys and other materials for wear and corrosion resistant applications. More specifically, the present disclosure provides hardface coatings that include a network of titanium monoboride (TiB) needles or whiskers in a matrix, which are formed from titanium (Ti) and titanium diboride (TiB$_2$) precursors by reactions enabled by the inherent energy provided by the process heat associated with coating deposition and, optionally, coating post-heat treatment. These hardface coatings are pyrophoric, thereby generating further reaction energy internally, and may be applied in a functionally graded manner. The hardface coatings may be deposited in the presence of a number of fluxing agents, beta stabilizers, densification aids, diffusional aids, and multimode particle size distributions to further enhance their performance characteristics.

Thus, the present disclosure provides a family of coatings or surface materials on substrate metal alloy systems for wear and corrosion resistant applications provided by deposition processes including, for example, thermal spraying, physical vapor deposition (PVD), powder coating followed by post-heat treatment, as well as by slurry coating. The reinforced composite structure in the coatings is preferably formed during the thermal spray or PVD processes, whereby the process heat provides the inherent energy to facilitate the reaction for the formation of the desired composition. In such cases, post-heat treatment is not necessary; however, in some cases, such post-heat treatment may increase the percentage of reinforcement in the matrix.

Although not a primary focus of the present disclosure, surface engineering, surface modification, or surface alloying of the substrate metal alloys may be accomplished by depositing a slurry, suspension, blend, or mixture of selective materials onto a surface using a number of methods, such as painting, spraying, thermal spraying, dipping, powder coating, etc., and then reactively forming the surface by heating using laser radiation, plasma radiation, infrared radiation, electron beam radiation, microwave radiation, induction, welding, etc., techniques. The surface coatings formed by this approach change the surface characteristics of a component or structure to provide properties of high hardness, high temperature strength, wear and corrosion resistance, and strong adherence to the substrate, without significantly changing the bulk material properties. Layers or functional grading may be employed to increase bonding strength and adherence or to mitigate differences in the coefficient of thermal expansion (CTE), whether or not post-heat treatment is utilized. The surface may be applied to finished components by portable field techniques, or fabricated onto sheet materials prior to the final manufacturing steps.

The thermal spraying methods (e.g., plasma spraying, combustion spraying, wire-arc spraying, and cold spraying) and PVD methods (e.g., cathodic arc methods, electron beam methods, evaporation methods, pulsed laser methods, and sputtering methods) may be employed to apply the family of coatings of the present disclosure directly onto substrate materials with or without further high temperature heat treatment or post-heat treatment. Additionally, since the TiB compositions of the present invention are pyrophoric, the inherent heat generated enhances the required reactions and formation and growth of the desired TiB needles or whiskers.

In any of the above cases, the network of TiB needles or whiskers in the matrix provides a very high strength material, surpassing some of the best ceramic materials available, especially for reinforced metal alloy composite structures and coatings. In general, TiB is exceptionally hard and chemically inert. An important advantage of TiB over other hard ceramics is that TiB may be cut by electro-discharge machining (EDM) without significant difficulty, among other advantages.

In one exemplary embodiment, the present disclosure provides a surface treatment for a metal alloy substrate or other material substrate providing improved wear and corrosion resistance for a resulting composite structure, including: a layer of titanium and boron deposited on a surface of the substrate in the presence of sufficient deposition process heat such that diffusion interactions occur and the titanium and boron react to form elongate titanium monoboride structures in a matrix. The boron is deposited as titanium diboride. The matrix includes titanium. Preferably, the matrix includes β-titanium. The titanium and boron are deposited via one of a thermal spraying and physical vapor deposition technique. The titanium and/or boron are deposited at a temperature of greater than about 800 degrees C. The titanium and boron are deposited in one of a substantially heated and a substantially melted state. The titanium and boron partially diffuse into the surface of the substrate to form a reinforced material intermingled with the surface of the substrate to provide the composite structure. Optionally, the layer of titanium and boron further includes a fluxing agent selected from the group consisting of $CaF_2$, Si, and B. Optionally, the layer of titanium and boron further includes a beta stabilizer selected from the group consisting of molybdenum, vanadium, tantalum, niobium, manganese, iron, chromium, cobalt, nickel, copper, and silicon. Optionally, the layer of titanium and boron further includes a densification aid selected from the group consisting of Fe, Mo, and an Fe alloy. Optionally, the layer of titanium and boron further includes a diffusional aid selected from the group consisting of $CaCO_3$, $CaF_2$, $NaHCO_3$, and $KBF_4$. Optionally, the layer of titanium and boron comprises a plurality of particle sizes to aid diffusion interactions. Optionally, the layer of titanium and boron is deposited on the substrate in a functionally gradient manner. Optionally, the layer of titanium and boron is subjected to heat treatment subsequent to deposition on the substrate.

In another exemplary embodiment, the present disclosure provides a method for surface treating a metal alloy substrate or other material substrate to provide improved wear and corrosion resistance for a resulting composite structure, including: depositing a layer of titanium and boron on a surface of the substrate in the presence of sufficient deposition process heat such that diffusion interactions occur and the titanium and boron react to form elongate titanium monoboride structures in a matrix. The boron is deposited as titanium diboride. The matrix includes titanium. Preferably, the matrix includes β-titanium. The titanium and boron are deposited via one of a thermal spraying and physical vapor deposition technique. The titanium and/or boron are deposited at a temperature of greater than about 800 degrees C. The titanium and boron are deposited in one of a substantially heated and a substantially melted state. The titanium and boron partially diffuse into the surface of the substrate to form a reinforced material intermingled with the surface of the substrate to provide the composite structure. Optionally, the layer of titanium and boron further includes a fluxing agent selected from the group consisting of $CaF_2$, Si, and B. Optionally, the layer of titanium and boron further includes a beta stabilizer selected from the group consisting of molybdenum, vanadium, tantalum, niobium, manganese, iron, chromium, cobalt, nickel, copper, and silicon. Optionally, the layer of titanium and boron further includes a densification aid selected from the group consisting of Fe, Mo, and an Fe alloy. Optionally, the layer of titanium and boron further includes a diffusional aid selected from the group consisting of $CaCO_3$, $CaF_2$, $NaHCO_3$, and $KBF_4$. Optionally, the layer of titanium and boron comprises a plurality of particle sizes to aid diffusion interactions. Optionally, the layer of titanium and boron is deposited on the substrate in a functionally gradient manner. Optionally, the layer of titanium and boron is subjected to heat treatment subsequent to deposition on the substrate.

In a further exemplary embodiment, the present disclosure provides a method for surface treating a metal alloy substrate or other material substrate to provide improved wear and corrosion resistance for a resulting composite structure, including: depositing a layer of titanium and boron on a surface of the substrate; and subsequently heating the layer of titanium and boron such that diffusion interactions occur and the titanium and boron react to form elongate titanium monoboride structures in a matrix.

BRIEF DESCRIPTION OF THE DRAWINGS

The present disclosure is illustrated and described herein with reference to the various drawings, in which like reference numbers are used to denote like coating system components/method steps, as appropriate, and in which.

DETAILED DESCRIPTION OF THE DISCLOSURE

Again, in various exemplary embodiments, the present disclosure provides hardface coating systems and methods for metal alloys and other materials for wear and corrosion resistant applications. More specifically, the present disclosure provides hardface coatings that include a network of titanium monoboride (TiB) needles or whiskers in a matrix, which are formed from titanium (Ti) and titanium diboride (TiB$_2$) precursors by reactions enabled by the inherent energy provided by the process heat associated with coating deposition and, optionally, coating post-heat treatment. These hardface coatings are pyrophoric, thereby generating further reaction energy internally, and may be applied in a functionally graded manner. The hardface coatings may be deposited in the presence of a number of fluxing agents, beta stabilizers, densification aids, diffusional aids, and multimode particle size distributions to further enhance their performance characteristics. This network of TiB needles or whiskers in a matrix 10 applied to the surface of a substrate 12, such as a metal alloy or other material, is illustrated conceptually in FIG. 1. The network of TiB needles or whiskers (i.e., matrix) 10 may be applied via a thermal spray or PVD technique or the like, with or without post-heat treatment or the like, or via a spray or slurry coating technique or the like, with post-heat treatment or the like. In both cases, superior overall wear and corrosion resistance is achieved. The reinforced titanium (Ti) and boron (B) materials are interjoined with the substrate 12 to provide an enhanced composite structure. The TiB needles or whiskers 10 are formed by a reactive mechanism governed by the diffusional interactions caused by either heating or melting processes: Ti+2B→TiB$_2$, Ti+TiB$_2$→2TiB. Importantly, for the purposes of this disclosure, these diffusional interactions are enabled by in-process heating or melting during deposition. Exemplary preferred temperature ranges include, but are not limited to, 800-1350 degrees C. It should be noted that the network of TiB needles or whiskers 10 are formed in the presence of Ti, and preferably β-Ti.

Figure 1:
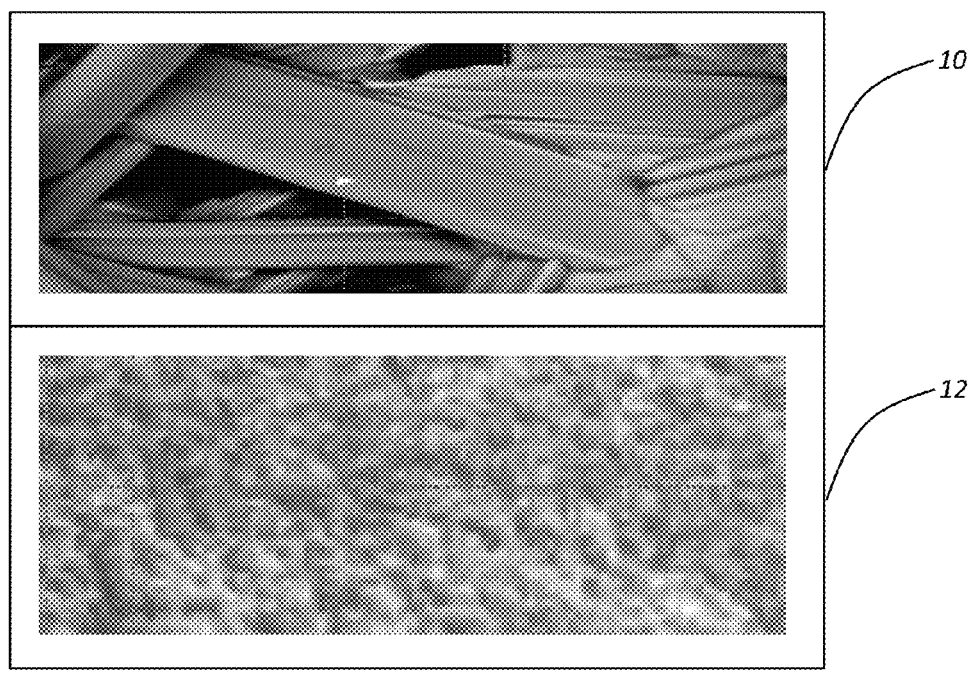
FIG. 1 is a schematic diagram illustrating a network of TiB needles or whiskers in a matrix applied to the surface of a substrate, such as a metal, metal alloy, or other material, in accordance with the present disclosure.
Figure 2:
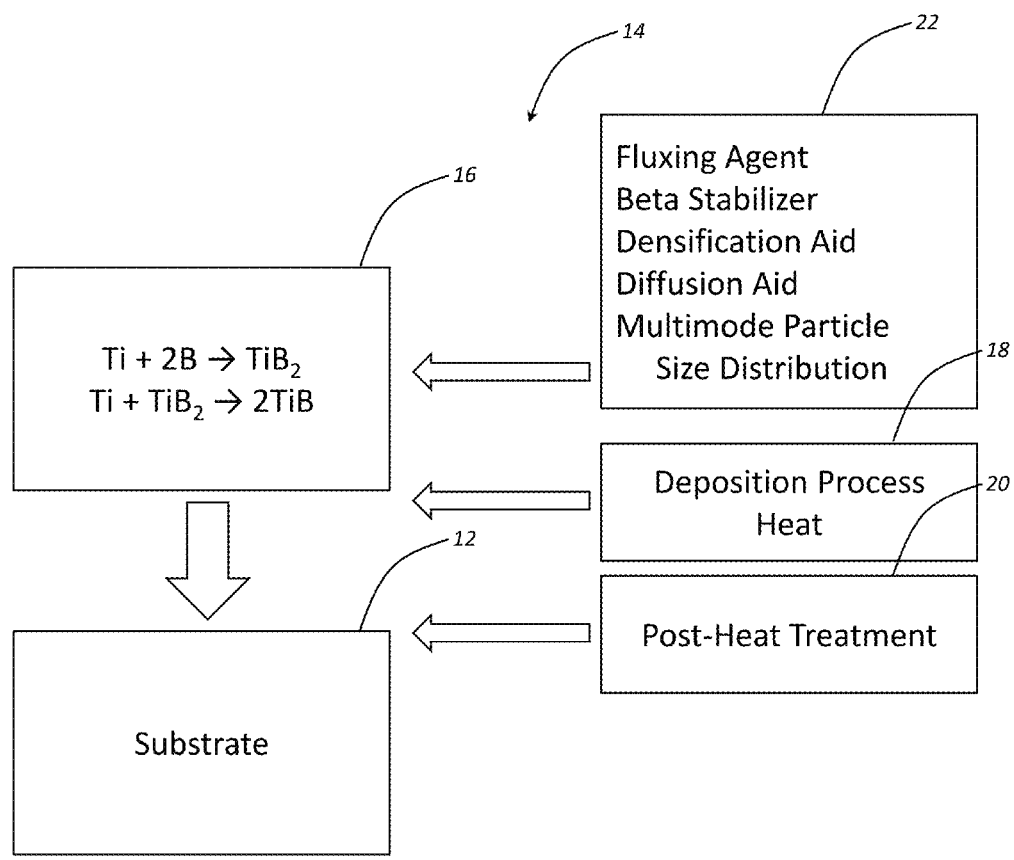
FIG. 2 is a schematic diagram illustrating one exemplary embodiment of a method for forming a coating or layer comprising a network of TiB needles or whiskers on the surface of a substrate, such as a metal, a metal alloy, or other material, in accordance with the present disclosure.

Referring now specifically to FIG. 2, in one exemplary embodiment of the present disclosure, the method 14 for forming a coating comprising the network of TiB needles or whiskers 10 (FIG. 1) on the surface of a substrate 12, such as a metal, a metal alloy, or another material, includes depositing Ti and B 16 on the surface of the substrate 12, optionally via thermal spraying or PVD, such that sufficient in-process heat 18 is added to allow diffusional interactions to form the network of TiB needles or whiskers 10. In this regard, the original Ti and B, intermediate TiB$_2$, and resulting TiB are in a heated or melted state when deposited. Optionally, post-heat treatment 20 of the deposited coating is provided, such that the percentage of reinforcement in the matrix is increased, for example. Again, it should be noted that the network of TiB needles or whiskers 10 are formed in the presence of Ti, and preferably β-Ti, and also, optionally, borides, carbides, silicides, etc. As described in greater detail herein below, the Ti and B may be deposited in the presence of a number of fluxing agents, beta stabilizers, densification aids, diffusional aids, and multimode particle size distributions 22 to further enhance the performance characteristics of the resultant network of TiB needles or whiskers 10.

Similarly, although not the primary focus of this disclosure, a strong, tough, and hard metal-ceramic composite may be formed on the surface of the substrate 12 by applying the Ti and B, optionally along with a self-fluxing agent and other trace components, as a slurry, paste, suspension, blend, or mixture via painting, spraying, thermal spraying, dipping, powder coating, or the like, and then heat treating using laser means, plasma means, electron beam means, gas torch means, electric arc (e.g., tungsten inert gas (TIG)) means, infrared means, microwave means, induction means, etc. for localized heating, in contrast to a "bulk heating" technique.

In the simplest exemplary embodiment of the present disclosure, the materials for surfacing consist of Ti and TiB$_2$ in the presence of a fluxing agent. The coating or alloyed surface consist of TiB in the presence of Ti, preferably β-Ti, but may also include TiB$_2$, borides of chromium, tantalum, iron, nickel, and other metal alloys, and, in some cases, carbides of these metals, and may be reactively formed on titanium metal, steel, and other metal alloys. In some cases, silicon is added to aid in the formation of intermetallics, and promote self-fluxing in conjunction with B. Preferably Mo and/or Nb are added to act as stabilizers of β-Ti.

The TiB needles or whiskers 10 are formed in the matrix by a reactive mechanism which is governed by diffusional interactions either by heating or melting processes. Beta stabilizers, densification aids, diffusional aids, and multimode powder particle distributions increase these interactions and, thus, aid in the reactive formation of the TiB needles or whiskers 10. Molten, semi-molten, or liquid phases for one or both of the reactive species are preferable. Processes where the molten, semi-molten, or liquid phases are inherent, such as thermal spray methods, provide an effective vehicle for the reactive formation of the TiB needles or whiskers 10.

Again, in an alternative exemplary embodiment of the present invention, powders are blended into a slurry, applied to a substrate surface, or applied by powder coating (as by electrostatic methods), and heated to reactively form needle-shaped TiB during growth, leading to a high aspect ratio. In other exemplary embodiments, thermal spray and/or PVD methods are used to directly apply and form the desired compositions on the substrates 12, to apply gradient interfaces, where appropriate, to mitigate bonding weaknesses or CTE differences and issues, and to produce coatings from near full density to engineered porosity. In the simplest case, the titanium-titanium monoboride (Ti—TiB) composite coatings 10 are established, produced, and/or formed from the precursor formulations during or immediately after deposition.

The high-aspect ratio morphology is preferred to provide greater stiffness, strength, creep resistance, and hardness. The fluxing agent, preferably an inorganic fluxing agent, is used to protect the powders from oxidation, to promote homogenous melting, and to minimize solidification defects. A number of fluxing agents may be used, including CaF$_2$, or B and SI, which, in conjunction, act with self-fluxing characteristics. The flux forms slag crusts after reactive heating or melting, and, thus, no flux exists in the surface composite layer. The heating may be accomplished by a number of different techniques, such as laser, electron beam, or infrared scanning across the surface. The deposited slurry may be cured by heating the surface to 500-1000 degrees C., depending upon the slurry carrier solvent, with subsequent heating to melt the surface materials, thereby forming an interface between the melted and un-melted regions. During the melting of the surface, a large amount of hexagonal-pillar-shaped primary TiB and fine needle-shaped eutectic TiB are formed in the melted region, which is directly related to the B content. The Ti—B phase diagram shows a eutectic reaction occurring at 1540 degrees C. with a B content of 1.7%. The solubility of B in Ti is nearly zero, and, thus, the TiB phases are always formed during solidification. When the B concentration exceeds the eutectic concentration, primary TiB forms first, followed by the formation of the eutectic TiB. Only the eutectic TiB is formed when the B concentration value is equal to or below 1.7%.

As used herein, the term "slurry" is used to describe a mixture having a watery consistency and including insoluble matter in a liquid. The carrier facilitates application of the powder to the workpiece surface. For example, the liquid carrier may consist of alcohol, a water-alcohol mixture, an alcohol-ethylacetoacetate mixture, or an alcohol-acetone mixture, to name just a few. The carrier acts as a medium for carrying or transporting the coating materials to the workpiece surface. The carrier is typically evaporated during the coating curing process. There are a number of commercially available suspension media that may be used. For example, experiments were performed using HPC, the commercial designation of a carrier medium manufactured by ZYP Coatings, Inc. of Oak Ridge, Tenn. This particular suspension medium consists of 98% water and 2% Mg—Al-silicate. Surface active agents, or surfactants, such as sodium lauryl sulfate, polyvinyl alcohol, and carbowax, may be added to maintain suspension of the solid phase. Lubricants, such as stearic acid, may be added to assist in consolidation of the slurry components. Reagents to produce slurries include Klucel "G" (hydroxypropylcellulose) and polyvinylpyrrolidone (PVP).

Exemplary beta stabilizers include molybdenum, vanadium, tantalum, niobium, manganese, iron, chromium, cobalt, nickel, copper, and silicon. The beta stabilizers are subdivided into two groups: beta-isomorphous (e.g., vanadium, niobium, tantalum, molybdenum, and rhenium) and beta-eutectoid (e.g., copper, silver, gold, palladium, indium, lead, bismuth, chromium, tungsten, manganese, iron, cobalt, nickel, uranium, hydrogen, and silicon). Vanadium, molybdenum, and niobium are the most frequently used beta-isomorphous forming elements in titanium-based alloys. In general, a beta stabilizer is an alloying element that favors the beta crystal structure and lowers the alpha-to-beta transformation temperatures.

As mentioned herein above, a densification aid may be added to help to increase the density and decrease the porosity, and especially in a multimode packing of starting powder sizes. Examples of powder densification aids are pure Fe, pure Mo, or Fe alloys, such as Fe—Mo, while the Mo and Fe—Mo can act as beta stabilizers as well. Other densification aids include Al, Mn, Cr, V, Ga, and alloys such as Fe—Mn and Fe—Ga. The addition of approximately 10 wt % Fe—Mo may significantly reduce processing times. The densification aid typically has a melting point below the process temperatures used for needle or whisker growth, thus, producing a liquid phase below or near the processing temperatures. The Fe—Mo alloy is in a liquid phase around 900 degrees C., and is stable at higher temperatures.

A preferable powder is one with various sized particles for better packing; thus, multimode sized particles or tri-modal sized powders provide better packing and more contact, which aids in the diffusion and reaction of the Ti and $TiB_2$ and other reactive processes. As an example, using Ti powders of around 40-45 microns, typical of plasma spray processes, and also 10-15 microns, along with the $TiB_2$ powders of around 2 microns, allows moving the powders through the feeders effectively and more optimum contact as the molten droplets are deposited onto the substrate.

Although TiB needle or whisker formation may occur, with good contact and diffusion, between 600 degrees C. and 1600 degrees C., a more practical heat treatment would be between 1200 degrees C. and 1400 degrees C., with a preferable temperature heat treatment range of 1250 degrees C. to 1350 degrees C. Since reaction occurs by contact, diffusional aids are important and increase the mobility and diffusion of reactive atoms or molecules. Diffusional aids include calcium carbonate, calcium fluoride, sodium bicarbonate, sodium chloride, sodium fluoride, potassium tetrafluoroborate, potassium bicarbonate, ammonium chloride, barium fluoride, lithium bicarbonate, or any combination thereof, added from about 2 wt % to 40 wt %.

TiB has a high elastic modulus value (371 GPa), a CTE close to Ti ($6.2 \times 10^{-6}$/degree C. and $8.2 \times 10^{-6}$/degree C., respectively), a density of 4.56 g/cc, compared to 4.5 g/cc for Ti, and may readily form as a primary phase and/or eutectic phase during solidification processing. Mo and Nb powder may be added as beta stabilizing elements. In another example, the substrate may be a Ti alloy, such as Ti-6Al-4V, and the powder blend or slurry may contain MoB powder, $TiB_2$ powder, and $CaF_2$ flux. With a flux mixing ratio of 40 wt %, the melted region has a 1.1 mm to 1.5 mm thick reacted surface of TiB formed homogeneously, without defects. The formation of the TiB in the melted region greatly improves the Vickers hardness, high-temperature Vickers hardness, and the wear resistance to levels 2 to 5 times higher than those of the Ti alloy substrate. The addition of MoB powders to the blend allows the fabrication of surface-alloyed materials with various properties by controlling the kind, size, and volume fraction of TiB in the surface matrix. On Ti alloy substrates, the melted region formed by powder blends containing $TiB_2$ and 40 wt % $CaF_2$ flux or $TiB_2$—MoB-$40CaF_2$, contained hexagonal-pillar-shaped primary borides and needle-shaped eutectic borides, whereas only needle-shaped eutectic borides are found in the MoB-$40CaF_2$ blends. This is directly related to the amount of B in the melted region. The $TiB_2$-$40CaF_2$ blend provided the highest hardness and wear resistance. The wear resistance improves as the TiB volume fraction or hardness in the melted region increases. When MoB is added to the blend, Mo dissolved in the Ti matrix promotes β-Ti transformation since Mo is a β-Ti stabilizer. Since β-Ti is harder than α-Ti, the presence of Mo affects the overall hardness. Additionally, Mo provides a smoother surface important to many wear applications. Ti has a higher chemical affinity for B atoms than Mo; therefore, TiB forms instead of MoB. The proper amount of flux prevents oxide formation by protecting the powder melt from air, decomposing $TiO_2$, and precipitating borides evenly in the melted region by the homogenous melting of boride powders. The flux does not affect the composition of the surface alloyed materials because no chemical reaction occurs between the flux and the substrate. The flux reacts with $TiO_2$ and $H_2O$ to from CaO, which forms as a slag on the surface and prevents oxidation of the melted region by protecting it from the air. It is desirable to use the smallest amount of flux possible to increase the volume fraction of boride and hardness. The resultant surface is a uniform, continuous, and crack-free coating with a sound and adherent interface with the metal alloy substrate, such as Ti or steel, for example. TiB also plays a role in improving high-temperature properties, since it is insoluble and chemically stable at temperatures over 1000 degrees C. On steel, the coating has a composite nature with TiB needles and iron from the steel uniformly distributed in the melt zone.

Although the process described above employs temperatures at or above the melting points of the surface, lower temperatures may be used when the substrate or component structure requires less heat. Surface alloying with TiB needle formation and growth may occur in the temperature range between 1100 degrees C. and 1300 degrees C.; however, the eutectic TiB needles require a temperature of 1540 degrees C. at a low B concentration. To obtain an alloy with high abrasive wear resistance, it must have a eutectic structure in which the hard phase separates out in the form of thin ramified crystals acting as micro-reinforcement of the metallic matrix. A eutectic alloy whose metallic matrix has the composition of steel and whose strengthening phase is $TiB_2$ has, in the cast state, an abrasive wear resistance that is several times greater than the abrasive wear resistance of steel.

Another example of a powder blend for surface alloying to form a hardfaced coating on metal alloy substrates contains $TiB_2$ and TiC with a flux. The reactive surface modification may be accomplished by sintering at about 1200 degrees C. versus melting at greater than 1650 degrees C. The TiC is stable with sufficient diffusion onto the particle-titanium interface to create good bond strength. The $TiB_2$ particles react with the Ti in-situ, transforming the particulate $TiB_2$ into TiB needles.

Titanium diboride ($TiB_2$) is a ceramic of semi-metallic nature that reacts with Ti to form a titanium monoboride (TiB). $TiB_2$ has a hexagonal phase with the $AlB_2$ structure; whereas, the TiB formed by the reaction of Ti and $TiB_2$ occurs as needles embedded in excess Ti and is of the FeB type containing B chains.

To overcome the typical shortcomings of industrial coatings and to provide high wear and corrosion resistant surfaces on metal alloy substrates, surface alloying or reactive surface modification has been formed by depositing and heating a unique combination of materials, selected from the list, including boron, titanium diboride, molybdenum boride, silicon, self-fluxing materials, titanium, chromium boride, chromium, nickel, iron, molybdenum, niobium, and carbides.

Functionally graded or layered interfaces are used to overcome interfacial bonding weaknesses, especially when the coefficient of thermal expansion is significantly different between the substrate and the ceramic or cermet surface coating.

Additional examples of self-fusing alloys include self-fluxing materials deposited on substrates by thermal spray, slurry spray, painting, etc., and subsequently fused using a heating process (infrared, laser, electron beam, etc.), such as self-fusing Ni—Cr alloys or self-fusing fine grade WC alloys:

Self-fusing Ni—Cr alloy with Cr, B, Fe, Si, C, Ti, balance Ni:
1. self-fusing Ni—Cr alloy with 10Cr, 2.7B, 2.5Fe, 2.5Si, 0.15C, 1Ti, bal Ni
2. self-fusing Ni—Cr alloy with 10Cr, 3B, 2.5Fe, 2.5Si, 0.15C, 2Ti, bal Ni
3. self-fusing Ni—Cr alloy with 10Cr, 4.8B, 2.5Fe, 2.5Si, 0.15C, 10Ti, bal Ni
4. self-fusing Ni—Cr alloy with 17Cr, 4.2Fe, 4Si, 3.5B, 1C, 1Ti, bal Ni
5. self-fusing Ni—Cr alloy with 17Cr, 4.5Fe, 4Si, 3.5B, 1C, 2Ti, bal Ni Self-fusing Ni—Cr alloy with Cr, B, Fe, Si, C, TiB2, Ti, balance Ni:
1. self-fusing Ni—Cr alloy with 10Cr, 3.4B, 2.5Fe, 2.5Si, 0.15C, 1TiB2, 1Ti, bal Ni
2. self-fusing Ni—Cr alloy with 10Cr, 4.4B, 2.5Fe, 2.5Si, 0.15C, 2TiB2, 2Ti, bal Ni
3. self-fusing Ni—Cr alloy with 10Cr, 9.4B, 2.5Fe, 2.5Si, 0.15C, 10TiB2, 10Ti, bal Ni Self-fusing fine grade WC alloy with WC-12% Co aggregate, Ni, Cr, Fe, Si, B, C, 1Ti:
1. self-fusing fine grade WC alloy with WC-12% Co aggregate, 33Ni, 9Cr, 3.5Fe, 2Si, 2.2B, 0.5C, 1Ti
2. self-fusing fine grade WC alloy with WC-12% Co aggregate, 33Ni, 9Cr, 3.5Fe, 2Si, 2.5B, 0.5C, 2Ti Self-fusing fine grade WC alloy with WC-12% Co aggregate, Ni, Cr, Fe, Si, B, C, TiB2, Ti:
1. self-fusing fine grade WC alloy with WC-12% Co aggregate, 33Ni, 9Cr, 3.5Fe, 2Si, 2.9B, 0.5C, 1TiB2, 1Ti
2. self-fusing fine grade WC alloy with WC-12% Co aggregate, 33Ni, 9Cr, 3.5Fe, 2Si, 3.9B, 0.5C, 2TiB2, 2Ti Boride-containing Ni-base alloys are primarily composed of Ni, Cr, B, Si, and C, whereby the addition of Ti or $TiB_2$ provides the formation of TiB needles. The B content typically ranges from 1.5 to 3.5% without Ti and/or $TiB_2$, and with increases of 0.2% B per 1% Ti and 0.7% Ti per 1% $TiB_2$, depending on the Cr content, which is up to about 16%. Higher Cr alloys generally contain a large amount of B, which forms very hard chromium borides (~1800 DPH); however, the addition of Ti and/or $TiB_2$, requires additional B. These alloys are microstructurally complex as compared to other hardfacing alloys. Ti, Ni, Cr, B, and C determine the level and type of hard phase within the structure upon solidification, where B is the primary hard phase forming element for which Ti, Ni, and Cr compete and C is the second hard phase former. The dominant hard phase for the boride-containing Ni-based hardfacing alloys are $Ni_3B$, CrB, $Cr_5B_3$, $TiB_2$, TiB, and complex carbides, $M_{23}C_6$ and $M_7C_3$ types. The addition of $TiB_2$ supplies B in the formation of TiB.

The main purpose of Si is to provide, in conjunction with B, self-fluxing characteristics. But it is also an important matrix element, a potential promoter of intermetallic precipitates, and has a major influence on the wear properties of the alloys. B content influences the level of Si required for silicide ($Ni_3Si$) formation. The higher the B content, the lower is the Si content required to form silicides. Boride and carbide dispersions within the microstructure lead to excellent abrasion resistance, with low stress abrasion resistance generally increasing with B and C contents. The boride-containing Ni-based alloys possess moderate resistance to galling and are the least resistant to corrosion of the non-ferrous hardfacing materials, due to the lack of Cr in the matrix that follows boride and carbide formation.

The boride-containing Ni-based alloys were originally developed from brazing alloy compositions specifically for use with the spray and fuse process. During the fusing process, it is believed that oxides within the sprayed coating combine with some of the Si and B to form a borosilicate slag which floats to the surface of the deposit. These alloys are used in flame spray-and-fuse coatings for applications where excessive wear is a problem. Parts are prepared and coated as in typical thermal spray processes, and coatings are fused using flame or torch; induction; or in vacuum, inert, or hydrogen furnaces. These alloys generally fuse between 1010-1175 degrees C., which limits the substrate materials to those that can withstand this temperature range.

An example of a method to apply the reactive, surface-alloying hardface coating to a substrate is provided below.

After the surface alloying or coating formulation, such as the Ti—$TiB_2$-flux formulation, is applied to the substrate or workpiece, a method is provided for heat treating the surface coating on the workpiece without negatively affecting the structural characteristics of the underlying workpiece. Initially, a workpiece is supplied with a coating. The coating is then treated using an infrared (IR) radiation high heat flux process. Infrared radiation rapidly heats the coating material while the temperature of the body, or core, of the workpiece is maintained at a substantially lower temperature. From the heat delivered by the IR process to the applied coating materials, surface alloying or reactive surface modification occurs to form the hardface coating on the selected substrate.

The heating temperature is accurately controlled by varying the intensity of the IR radiation and the time of exposure to the IR radiation source. The intensity and time of exposure are varied, depending on characteristics of the workpiece core and coating materials, as well as the microstructural modification desired. Particular applications of this method may incorporate non-uniform and/or non-continuous heating profiles. A multiple-setpoint profile may be chosen to allow various thermal treatments, such as curing or pre-heating an applied formulation to pre-cure or pre-condition before the final thermal treatment for forming the surface. Regardless of the profile used, the IR intensity and exposure time may be controlled to prevent microstructural alteration of the workpiece core.

Infrared heating rapidly increases coating density, eliminating pores formed in the coating during deposition. Infrared heating also improves the cohesiveness of the coating material and/or the adhesion of the coating material to the workpiece surface. In some instances, coating adhesion to the workpiece is accomplished by partially melting the workpiece surface to enhance diffusion of the workpiece surface into the coating material. Other modifications or enhancements that are attainable with this method include sintering, alloying, and precipitation. These coating modifications may, in turn, be used to perform fusing or hardening of a coating or deposit, enhance joining of a coating to a workpiece substrate, or modify composition or microstructural features to achieve specific mechanical, chemical, or electrical properties. Further, the time of exposure to IR radiation determines the extent of base metal dissolution into the coating. Therefore, time of exposure may be used to control both the thickness and final composition of the coating. Non-uniform heating profiles may be applied across a target surface area to produce coating thickness or coating composition gradient structures. It is preferred that IR heating be performed in an inert atmosphere to minimize oxidation. For example, an argon-hydrogen (Ar-4% $H_2$) atmosphere works well.

In this embodiment of the present disclosure to form the surface alloyed modification, a method is provided for depositing, and subsequently heat treating, a metal, ceramic, or cermet material on the surface of a metal or ceramic workpiece, or depositing a molten, semi-molten, or melted powder particle distribution containing the titanium, titanium diboride, and/or boron along with other additives onto the selected substrate. The coating material formulation is provided as a powder or a blend of powders. The coating powder or blend of powders is mixed with a liquid suspension medium, which functions as a binder, facilitating application of the powder formulation to the workpiece surface. For some applications, a low melting temperature metallic binder is added to the coating mixture. The powder and suspension medium are mixed to produce a homogeneous paint or slurry for deposition on the workpiece surface via brush or spray-painting.

The coating is subjected to an IR radiation heating profile or to multiple setpoint heating profiles. Upon heating, the polymeric suspension medium is burned out. In some cases, a portion of the workpiece surface may diffuse into the coating. In some instances, the coating material facilitates the diffusion process. For instance, when carbon steel is coated with tungsten-carbide and then heated using IR radiation, carbon from the carbide dissolves into the steel and significantly lowers the melting point of the steel. For other applications, a low melting temperature metallic binder, such as a solder or braze alloy, is added to the coating mixture to facilitate bonding. In some cases, layers of materials or functionally graded materials are used to facilitate bonding or minimize CTE mismatch.

The time of exposure to IR radiation is varied to control the extent of base metal dissolution into the coating, thereby controlling the thickness and final composition of the coating. Non-uniform heating profiles may be applied across a target surface area to produce coating thickness or coating composition gradient structures. If flux agents are not used, it is preferred that IR heating be performed in an inert atmosphere to minimize oxidation. For example, an argon-hydrogen (4% $H_2$) atmosphere works well.

A method is provided for heat treating the surface coating of a workpiece, without negatively affecting the microstructural characteristics of the underlying workpiece. The term workpiece, as used herein, refers to a structure or body of material having a surface coating requiring heat treatment. For example, tools and equipment used for cutting and grinding often require surface coatings having particular characteristics, such as good hardness. The workpiece may be a metal, ceramic, polymer, composite, or some combination thereof.

The workpiece may be provided with or without a coated surface. In the latter instance, it is necessary to initially deposit a coating. A number of coating deposition techniques are available. An excellent example of a coating process is thermal spraying. Thermal spraying is adaptable to the deposition of ceramics, metals and metal alloys, polymers, composites, ceramic-metals, and multi-component, graded, or multilayered combinations of these materials. Formation of a coating having desired characteristics is accomplished by heat-treating the coating using a high heat flux process. In this method, heat treatment is accomplished using infrared (IR) radiation.

In contrast to commonly used coating treatments, IR radiation heating provides a means for rapidly heating the coating material while maintaining a substantially lower workpiece substrate temperature. Infrared radiation heating is preferably performed in an IR heating furnace. A variety of IR sources are available. For instance, tungsten-halogen based IR sources or a more powerful IR furnace, incorporating a plasma-based IR source, are available. The plasma-based IR furnace operates as a line-focus type system, whereby the coating is treated by scanning across the coating surface.

By maintaining the workpiece temperature below a critical value, the coating is modified while controlling the microstructure of the underlying workpiece material. The temperature to which the coating is heated is accurately controlled by varying the intensity of IR radiation and the time of exposure to the IR radiation source. The intensity of IR radiation and time of exposure to IR radiation will vary, depending on characteristics of the workpiece and coating materials, and the coating modification or enhancement desired. For most applications, the IR exposure time ranges from 5 to 300 seconds, with an exposure time of 30 to 60 seconds preferred. The preferred IR intensity, or heat flux density, will generally range up to a maximum value of about 3,500 Watts/cm². However, these variables are application specific and may be deviated from. For instance, particular applications may incorporate non-uniform and/or non-continuous heating profiles.

Infrared heating rapidly increases coating density by eliminating pores formed in the coating during deposition. IR heating is also used to improve the cohesiveness of the coating material and/or the adhesion of the coating material to the workpiece surface. It may be desirable to heat a portion of the workpiece surface, in addition to heating the coating, such that the microstructure of the heated portion of the workpiece surface is altered. The degree to which the workpiece surface microstructure is altered depends on a number of factors, including the respective workpiece and coating materials used, and the microstructural properties desired.

The step of IR heating may be controlled to initiate various material microstructure modifying mechanisms, including sintering, alloying, and precipitation. In the present method, sintering refers to densification and chemical bonding of adjacent particles, which is affected by heating to a temperature below the melting point of both the workpiece and coating materials. Sintering may occur at the interface between the coating and the underlying workpiece surface to improve interfacial adhesion. In addition, sintering may occur within the coating material itself, to improve densification and mechanical strength of the coating material. The term alloying refers to heating the workpiece and coating materials above their respective melting points to produce an interface comprising a mixture of the workpiece and coating materials. Alloying is a desirable mechanism for producing improved adhesion between the coating and underlying workpiece surface. The term precipitation describes a material modification process whereby the material being modified, i.e., the coating and/or the workpiece surface, is heated to produce a new solid phase that gradually precipitates within the particular solid alloy material as a result of slow, inner chemical reaction. This type of reaction is generally carried out to harden the particular material.

The present method may be performed in vacuum, air, or controlled and inert environments. Infrared heating is unique in that it may be applied to complex surface geometries with nominal effect on heating system geometry. Commonly used high heat flux methods require physical coupling to the coated surface, for example, with an induction coil. However, where the workpiece surface comprises an obscure geometry, a typical induction coil will not couple uniformly to the entire surface. Therefore, avoiding non-uniform heating of the coating surface requires specially designing a coil that follows the contours of the particular workpiece. Using the instant IR heating method, the specific intensity of the thermal energy may decrease as a function of distance between the IR source and the coating surface due to dispersion of the radiation. However, in contrast to known methods, this decrease in energy is nominal. Therefore, regardless of surface geometry, the workpiece coating may be uniformly heated. The instant method provides the further advantage of enabling the flexibility to heat, and thereby treat, specified portions of a surface. This flexibility is possible since the IR radiation may be directed or focused toward a particular area.

The method described herein has been successfully applied to a variety of coatings which, historically, have proven difficult to modify. For example, the method may be used to uniformly flux and sinter powder coatings over entire surface areas at a time, effectively eliminating residual coating porosity without heating the underlying substrate to the sintering temperature. Although other methods have been used to sinter an entire coating surface at the same time, without heating the underlying substrate, they typically produce inconsistent results over the treated area. Non-uniform sintering is further exacerbated when irregular surface geometries are being treated. In contrast, this method is useful for effectively sintering powder coatings across workpiece surfaces having complex geometries.

The present method has also been applied to non self-fluxing alloys. The term self-fluxing refers to coatings containing elements for dissolving oxides, facilitating wetting of the coating to the underlying workpiece substrate. Coatings which are not self-fluxing typically must be treated in a special atmosphere to prevent oxidation. Furthermore, the absence of a fluxing element hinders wetting to a workpiece surface.

Aluminum alloy substrates were thermal spray coated with aluminum. The samples were uni-directionally heated in an IR furnace to heat the surface coating and fuse pores formed in the coating. The workpiece coating was exposed to IR radiation, heating the coating to a temperature of 950 degrees C. for 60 seconds. This was accomplished without melting the underlying aluminum substrate, using a water-cooled backing plate, despite a substantially lower substrate melting point temperature of only 660 degrees C.

In another exemplary embodiment of the present disclosure, a method is provided for depositing, and subsequently heat treating, a metal, ceramic, or combination thereof, on the surface of a metal or ceramic workpiece. The coating material is provided in powder form. The coating powder may be mixed with a liquid suspension medium, or carrier, to form a slurry.

For some applications, a low melting temperature binder is added to the coating mixture. The binder acts as a glue to hold the coating materials together. In some instances, the binder material, like the carrier, is lost during the curing process. In other instances, the binder may remain in the cured coating, acting as a matrix material.

The slurry may include additional components for controlling physical characteristics of the slurry. For example, surface active agents, or surfactants, such as sodium lauryl sulfate, polyvinyl alcohol, and carbowax, may be added to maintain suspension of the solid phase. Lubricants, such as stearic acid, may be added to assist in consolidation of the slurry components.

The slurry is deposited on a workpiece surface, preferably by brush or spray-painting. However, it will occur to one skilled in the art that alternate deposition methods are available. For example, the workpiece could be immersed in the mixture or the slurry could be spray-dried upon the workpiece.

Again, the time of exposure to IR radiation determines the extent of base metal dissolution into the coating. Therefore, time of exposure may be used to control both the thickness and final composition of the coating. Non-uniform heating profiles may be applied across a target surface area to produce coating thickness or coating composition gradient structures. It is preferred that IR heating be performed in an inert atmosphere to minimize oxidation. For example, an argon-hydrogen (Ar-4% H$_2$) atmosphere works well.

For applications in which the aforementioned diffusion mechanism is not as effective, a low melting temperature metallic binder, such as a solder or braze alloy, may be added to the coating mixture. For example, a metallic matrix may be incorporated when a ceramic coating is being applied to a metal workpiece surface. The term low melting temperature refers to the fact that the metallic binder has a melting point below the melting point of the coating powder and the workpiece material. Upon melting, the metallic matrix wets to the workpiece surface and wets/embodies the coating powder particles. Thus, the binder forms a metallic matrix having a hard reinforcement material formed therein.

This method has been successfully implemented to deposit a variety of coatings on both metal and ceramic workpiece substrates.

The thermal spray and/or PVD methods are used to directly apply and form the desired compositions on substrates, to apply gradient interfaces where appropriate to mitigate bonding weaknesses or coefficient of thermal expansion differences and issues, and to produce coatings from near full density to engineered porosity. In its simplest formulation, the titanium-titanium monoboride (Ti—TiB) composite coatings are established, produced, and/or formed from the precursor formulations during or immediately after deposition. During the deposition process, the inherent energy of the process heats the precursor mixture or selected formulation to the appropriate temperature between 800 degrees C. and 1300 degrees C., for example, or higher in some cases (800 degrees C. to 1600 degrees C. or more), resulting in the reaction and formation of TiB primary and secondary (eutectic) phases within the Ti matrix. The TiB phases are manifested in the Ti matrix as whiskers and/or needles. The formation of the TiB phases occur during the deposition and during the consolidation of the composite coating after deposition. The preferred formulation contains approximately 18% by weight boron required to form the stoichiometric TiB composition in the Ti matrix, as shown by equations 1-3:

$$Ti+B \rightarrow TiB \quad (1)$$

$$Ti+2B \rightarrow TiB_2 \quad (2)$$

$$Ti+TiB_2 \rightarrow 2TiB \quad (3)$$

However, the Ti—TiB composite coatings may be formulated to result in coatings with a few % to more than 50% by weight TiB.

In some cases, β-stabilizers, such as Nb, Fe, Mo, Fe—Mo, or intermetallics or alloys of these and other β-stabilizers for titanium, as discussed above, are added to the precursor mixture or formulation to produce the β-Ti matrix. In some cases, flux agents, as described above, are added and especially when the coating deposition process is performed in atmospheric environments, typical for some thermal spray processes. Vacuum plasma spraying and PVD processes typically do not require flux agents to mitigate oxidation from atmospheric oxygen, but may be added to act as a flux typical of "spray-and-fuse" materials or formulations. Although the subsequent or post-heat treatment is not required, the resulting chemistry is still accomplished by the presence of added Si, B, etc., containing species and compositions in the presence of surface oxygen and any oxides.

Beta stabilizers, densification aids, diffusional aids, and multimode powder particle distributions increase the interactions and, thus, aid in the reactive formation of the TiB whiskers. Molten, semi-molten, or liquid phases for one or both of the reactive species are more preferable. Processes where the molten, semi-molten, or melted phases are inherent, such as thermal spray methods, provide an effective vehicle for the reactive formation of the TiB whiskers. Titanium powders between 2 microns and 120 microns (and even greater in some cases) along with boron and/or titanium diboride powders between 2 microns and 15 microns in diameter (and even greater in some cases) are amendable to the thermal spray processes. However, using titanium powders around 40-45 microns, typical of plasma spray processes, and also 10-15 microns along with the TiB$_2$ powders around 2 microns, allows moving the powders through the feeders effectively and more optimum contact as the molten droplets are deposited onto the substrate.

Powder is used for many thermal spray processes; however, extruded wire or cored wire containing the selective concentration of components may be used when the thermal spray process is setup for wire feed materials.

The fluxing agent, preferably an inorganic flux, is used to protect the powders from oxidation, to promote homogenous melting, and to minimize solidification defects. A number of fluxing agents can be used including a CaF$_2$ flux or an addition of Si and B, in conjunction, acts with self-fluxing characteristics. The flux forms slag crusts after reactive heating or melting, and, thus, no flux exists in the surface composite layer. The heating during the deposition and during consolidation after deposition is used to initiate and accomplish the action.

Thermal spraying is a group of coating processes in which finely divided metallic or nonmetallic materials are deposited in a molten or semi-molten condition to form a coating. In thermal spray processes, materials are melted and propelled to the substrate with kinetic energy to build up as a coating through one or more possible bonding mechanisms; that is, mechanical bonding, diffusion, and Van der Waals forces. The coating material may be metals, cermets, or ceramics in the form of powder, rod, wire, or molten materials. Thermal spray processes include combustion spraying, plasma spraying, and wire-arc spraying.

Combustion spraying uses the combination of a fuel gas and may be divided into high velocity spraying and flame spraying deposition techniques. During high velocity oxy-fuel (HOVF) spraying, a mixture of gaseous fuel (such as hydrogen, methane, propane, propylene, acetylene, natural gas, etc.) or liquid fuel (such as kerosene) and oxygen is fed into a combustion chamber, where they are ignited and combusted continuously. The resultant hot gas, at high pressure, travels through a converging-diverging nozzle and then through a straight section, exiting with a jet velocity (>1000 m/s) that exceeds the speed of sound. A powder feed stock is injected into the gas stream, which accelerates the powder up to 800 m/s. The stream of hot gas and powder is directed towards the surface to be coated. The powder partially melts in the stream, and deposits upon the substrate. The resulting coating has low porosity and high bond strength.

In flame spraying, an oxyacetylene flame (temperature ranging from 2800 degrees C. to 3200 degrees C.) is used to melt the powder or wire feedstock, which is fed into the flame through a central passage by carrier gases, such as argon or nitrogen. The molten materials are transported to the substrate by the mixed gases to form a coating.

Plasma spraying methods are performed in atmospheric or vacuum conditions. In a plasma spraying process, the material to be deposited is typically in the form of a powder, liquid, suspension, or wire and is introduced into a plasma jet, emanating from a plasma spray gun or torch. In the plasma, where the temperature is on the order of 1,000 K, the material is melted and propelled towards a substrate. The molten droplets flatten, rapidly solidify, and form a deposit.

In wire arc spraying, two consumable metal wires are fed independently into the spray gun and electrically charged to create an arc between them. The heat from the arc melts the incoming wire, creating droplets of molten materials that are entrained in an air jet from the gun. The entrained molten feedstock deposits and builds up onto a substrate.

Physical vapor deposition (PVD) includes a variety of vacuum deposition methods to form thin films by the condensation of a vaporized form of the desired film material onto substrate surfaces. Purely physical processes, such as high temperature vacuum evaporation with subsequent condensation or plasma sputter bombardment, are involved. A number of different methods are used to deposit the coating, including cathodic arc, electron beam, evaporation, pulsed laser, and sputtering (plasma, e-beam, RF, etc.). Cathodic arc deposition employs a high power electric arc discharged at the feedstock target material to blast away some material into highly ionized vapor that is deposited onto the substrate. In electron beam PVD, target material is heated to a high vapor pressure by electron bombardment in a vacuum, transported by diffusion, and deposited by condensation on the substrate. During the evaporative PVD process, material is heated to a high vapor pressure by electrically resistive heating in a vacuum and deposits onto a substrate. In the pulsed laser deposition process a high power laser ablates material from the target into a vapor that condenses and deposits onto the substrate. During sputter deposition, a glow plasma discharge, which is usually localized around the "target" by a magnet, bombards and sputters material away as a vapor for subsequent deposition.

The $TiB_2$ precursor conversion to TiB coatings technology of the present disclosure provides a family of Ti—TiB composite coatings or surface materials that have properties of high hardness, stiffness, strength, creep-resistance, wear-resistance, corrosion-resistance, and adherence. Previously, processes to make Ti—TiB composite components, not coatings, have been reported in the literature. The goal to make the components has been to reinforce Ti alloys with TiB to provide improved performance relative to specific strength, bulk modulus and stiffness, creep, corrosion resistance, wear resistance, and high temperature applications. The composites are Ti alloys reinforced with TiB needles or whiskers and take advantage of the high modulus of TiB (371 GPa), coefficient of thermal expansion of TiB ($6.2 \times 10^{-6}$/degree C.) close to Ti ($8.2 \times 10^{-6}$/degree C.), clean interface between Ti and TiB because of the crystallographic relationship, formation of primary and secondary eutectic phases during solidification, and density of TiB (4.56 g/cc) compared to Ti (4.5 g/cc).

Previously, the most common techniques reported to generate composite structures have been combustion synthesis, rapid solidification processing, and powder metallurgy that either uses commercial powders or pre-alloyed gas-atomized powders, or mechanically mixed or alloyed powders. Following initial alloying and/or cold pressing, the composites are usually free-sintered or hot isostatically pressed at 1300 degrees C. and a uniaxial pressure of 28 MPa in an argon atmosphere for 2 hours, which enables the densification and completes the reaction between the Ti and $TiB_2$ powders to form the TiB whiskers inside a continuous Ti matrix. The approach is based on the solid-state composite processing temperature between 800 degrees C. and 1300 degrees C. The use of TiB as a reinforcement is attractive because there is no intermediate phase between the Ti and TiB, and the formation of TiB requires a far lower amount of B as compared to $TiB_2$.

The Ti—$TiB_2$ precursor composition is based on the percentage by weight, atomic percentage, or molecular content of titanium in titanium and titanium alloys employed in the precursor composition. Pure or almost pure titanium metal (all grades) and all titanium alloys may be used as a precursor, including by weight percent, Ti-6Al-4V, Ti-24Al-10Nb (atomic %), Ti-5Al-2.5Fe, Ti-4.3Fe-7Mo-1.4Al-1.4V, Ti-6.4Fe-10.3Mo, Ti-24.3Mo, Ti-53Nb, Ti-3Al-2.5V, Ti-6Al-7Nb, Ti-4.5Al-5Mo-1.5Cr, Ti-8Mn, Ti-5Al-2Sn-2Zr-4Mo-4Cr, Ti-6Al-2Sn-4Zr-6Mo, Ti-6Al-6V-2Sn, Ti-10V-2Fe-3Al, etc., and all other Ti alloys.

Note that the powder formulations or precursor formulations may be fed into the thermal spray gun either internally or externally, depending upon the gun design. The reaction may initiate and form the TiB phases and other compounds (depending upon chemistry or chemical composition) either in the hot zone of the plasma flame or during consolidation after deposition onto a substrate. This is illustrated in FIGS. 3 and 4.

Figure 3:
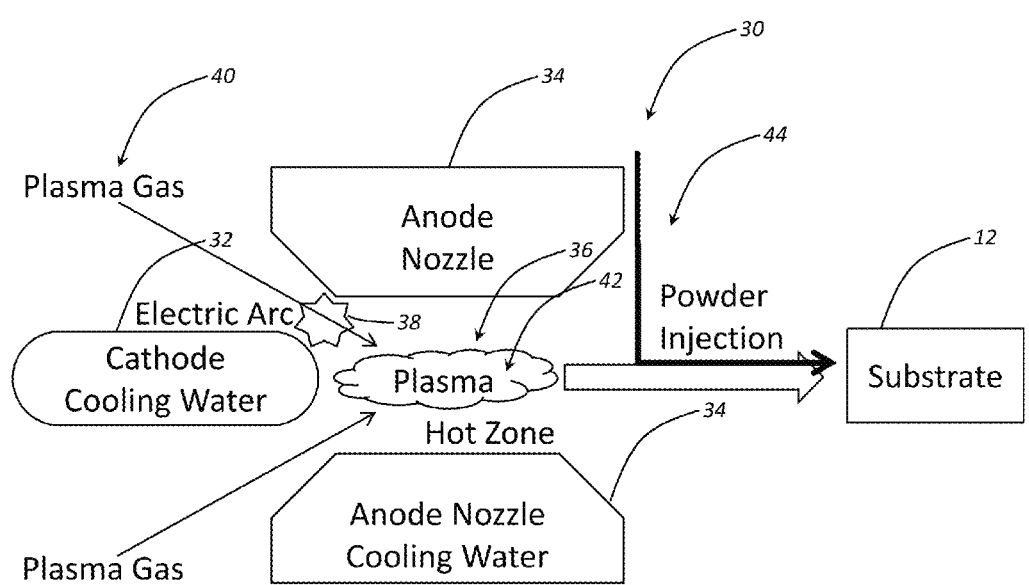
FIG. 3 is a schematic diagram illustrating one exemplary embodiment of a plasma spray gun used to manufacture the coatings or layers of the present invention, utilizing external powder injection into a hot zone exiting the throat area of the gun.

Referring now specifically to FIG. 3, in one exemplary embodiment, the plasma spray gun 30 used to simultaneously form and apply the TiB coatings or layers 10 (FIG. 1) of the present disclosure includes a cooled cathode electrode 32 and a cooled anode electrode 34, the latter of which forms part of a nozzle 36. A high-intensity electric arc 38 is formed between the cathode electrode 32 and the anode electrode 34. A plasma gas 40, such as Ar, Ar/He, Ar/$H_2$, etc., is injected through the nozzle 36, through the electric arc 38, and forms an ionized gas plasma 42, which is ejected at velocity from the nozzle 36. Powder surfacing materials 44 are injected into the plasma 42 external to the hot zone and nozzle 36, and are ultimately deposited onto the surface of the substrate 12 (FIGS. 1 and 2).

Figure 4:
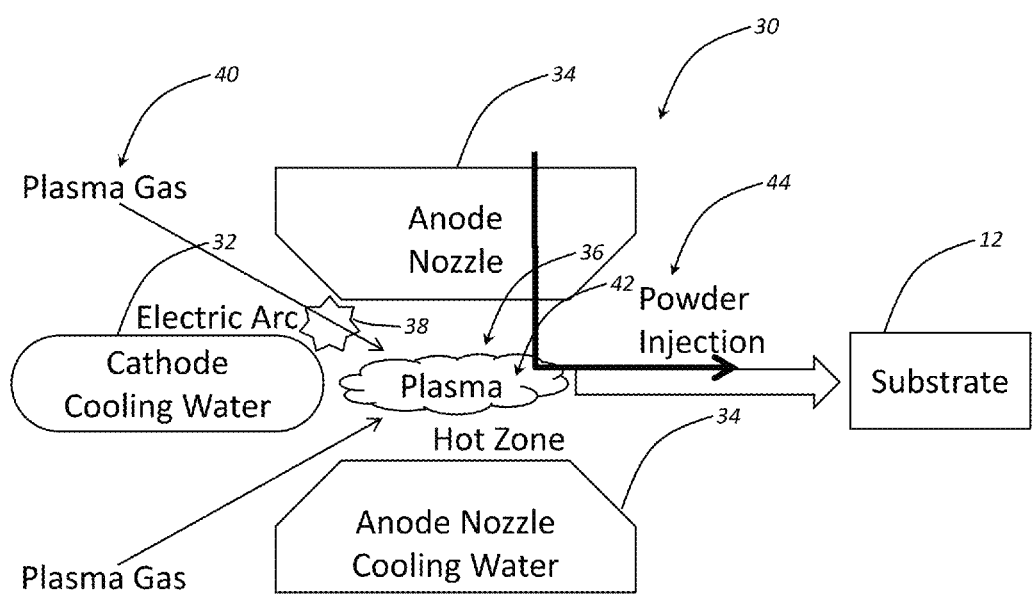
FIG. 4 is a schematic diagram illustrating another exemplary embodiment of a plasma spray gun used to manufacture the coatings or layers of the present invention, utilizing internal powder injection prior to the hot zone exiting the throat area of the gun.

Referring now specifically to FIG. 4, in another exemplary embodiment, the plasma spray gun 30 used to simultaneously form and apply the TiB coatings or layers 10 (FIG. 1) of the present disclosure includes a cooled cathode electrode 32 and a cooled anode electrode 34, the latter of which forms part of a nozzle 36. A high-intensity electric arc 38 is formed between the cathode electrode 32 and the anode electrode 34. A plasma gas 40, such as Ar, Ar/He, Ar/$H_2$, etc., is injected through the nozzle 36, through the electric arc 38, and forms an ionized gas plasma 42, which is ejected at velocity from the nozzle 36. Powder surfacing materials 44 are injected into the plasma 42 internal to the hot zone and nozzle 36, and are ultimately deposited onto the surface of the substrate 12 (FIGS. 1 and 2).

The following tables provide examples of chemical formulations (by weight %) for TiB whisker formation and reinforcement in a titanium alloy matrix (i.e., TiBor coating)

deposited onto a steel substrate, whereby a graded layer structure or a functionally gradient structure may be formed.

TABLE 1

Updated TiBor 1 Formulations

| Formula | TiB2 (wt %) | Ti (wt %) | Mo (wt %) | TiB (Vol %) | Vickers |
|---|---|---|---|---|---|
| 1 | 4.99 | 79.73 | 15.27 | 8.44 | 463 |
| 2 | 9.58 | 76.44 | 13.98 | 16.17 | 473 |
| 3 | 15.13 | 72.45 | 12.42 | 25.55 | 506 |
| 4 | 18.31 | 70.17 | 11.52 | 30.93 | 535 |
| 5 | 21.30 | 68.02 | 10.68 | 35.98 | 569 |
| 6 | 23.56 | 66.39 | 10.04 | 39.80 | 600 |
| 7 | 26.76 | 64.10 | 9.14 | 45.21 | 650 |
| 8 | 31.63 | 60.60 | 7.77 | 53.43 | 740 |
| 9 | 35.99 | 57.47 | 6.54 | 60.80 | 836 |
| 10 | 39.93 | 54.64 | 5.43 | 67.44 | 935 |
| 11 | 43.49 | 52.08 | 4.43 | 73.47 | 1035 |
| 12 | 45.15 | 50.89 | 3.96 | 76.27 | 1085 |
| 13 | 46.74 | 49.75 | 3.51 | 78.95 | 1134 |
| 14 | 48.25 | 48.66 | 3.08 | 81.51 | 1183 |
| 15 | 49.71 | 47.62 | 2.67 | 83.96 | 1232 |
| 16 | 49.20 | 40.80 | 0 | 100.00 | 1588 |

Graded Formulations

| TiBor1 Layer | TiBor/Steel | TiBor | Steel |
|---|---|---|---|
| 4 | 1 | 75 | 10 |
| 4 | 2 | 50 | 50 |
| 4 | 3 | 75 | 25 |
| 4 |   | 100 | 0 |
| 5 |   | 100 | 0 |
| 6 |   | 100 | 0 |

Table 1 provides the simplest formulation, labeled TiBor 1 Formulations, and an example of a graded or functionally gradient structure on a steel substrate. To form the graded or functionally gradient structure, a selected wt % of the TiBor 1 formulation is mixed with the appropriate wt % of the steel alloy to match the substrate alloy, which is graded to 100% composition of the final outer TiBor formulation.

TABLE 2

Updated TiBor 2 Formulations

| Formula | TiB2 (wt %) | Ti (wt %) | Mo (wt %) | Si (wt %) | B (wt %) | TiB (Vol %) | Vickers |
|---|---|---|---|---|---|---|---|
| 1 | 3.96 | 76.10 | 12.16 | 4.88 | 2.90 | 23.34 | 496 |
| 2 | 7.66 | 73.58 | 11.23 | 4.72 | 2.81 | 29.32 | 525 |
| 3 | 12.23 | 70.48 | 10.08 | 4.52 | 2.69 | 36.68 | 575 |
| 4 | 14.89 | 68.67 | 9.41 | 4.41 | 2.62 | 40.96 | 610 |
| 5 | 17.42 | 66.95 | 8.77 | 4.30 | 2.56 | 45.02 | 648 |
| 6 | 19.36 | 65.64 | 8.29 | 4.21 | 2.50 | 48.11 | 679 |
| 7 | 22.12 | 63.76 | 7.59 | 4.09 | 2.43 | 52.52 | 729 |
| 8 | 26.39 | 60.86 | 6.52 | 3.91 | 2.32 | 59.32 | 816 |
| 9 | 30.29 | 58.21 | 5.54 | 3.74 | 2.22 | 65.50 | 905 |
| 10 | 33.87 | 55.78 | 4.64 | 3.58 | 2.13 | 71.14 | 995 |
| 11 | 37.16 | 53.55 | 3.81 | 3.44 | 2.04 | 76.32 | 1085 |
| 12 | 38.70 | 52.50 | 3.42 | 3.37 | 2.00 | 78.75 | 1130 |
| 13 | 40.19 | 51.49 | 3.05 | 3.30 | 1.96 | 81.09 | 1175 |
| 14 | 41.62 | 50.52 | 2.69 | 3.24 | 1.93 | 83.33 | 1219 |
| 15 | 43.00 | 49.58 | 2.34 | 3.18 | 1.89 | 85.49 | 1262 |
| 16 | 52.24 | 43.33 | 0 | 2.78 | 1.65 | 100.00 | 1588 |

Graded Formulations

| TiBor2 Layer | TiBor/Steel | TiBor | Steel |
|---|---|---|---|
| 3 | 1 | 75 | 10 |
| 3 | 2 | 50 | 50 |
| 3 | 3 | 75 | 25 |
| 3 |   | 100 | 0 |
| 4 |   | 100 | 0 |
| 5 |   | 100 | 0 |

Table 2 expands the TiBor formulation to include B and Si. The graded layer or functionally gradient structure is formed as described for TiBor 1 formulation.

TABLE 3

Updated TiBor 3 Formulations

| Formula | TiB2 (wt %) | Ti (wt %) | Mo (wt %) | Si (wt %) | B (wt %) | Cr (wt %) | Fe (wt %) | C (wt %) |
|---|---|---|---|---|---|---|---|---|
| 1 | 3.33 | 64.05 | 10.23 | 4.11 | 2.44 | 12.22 | 3.06 | 0.56 |
| 2 | 6.48 | 62.25 | 9.50 | 4.00 | 2.38 | 11.88 | 2.97 | 0.54 |
| 3 | 10.41 | 60.02 | 8.58 | 3.85 | 2.29 | 11.45 | 2.86 | 0.52 |
| 4 | 12.73 | 58.71 | 8.04 | 3.77 | 2.24 | 11.20 | 2.80 | 0.51 |
| 5 | 14.95 | 57.45 | 7.53 | 3.69 | 2.19 | 10.96 | 2.74 | 0.50 |
| 6 | 15.65 | 56.48 | 7.13 | 3.52 | 2.16 | 10.78 | 2.69 | 0.49 |
| 7 | 19.11 | 55.08 | 6.56 | 3.54 | 2.10 | 10.51 | 2.63 | 0.48 |
| 8 | 22.94 | 52.90 | 5.67 | 3.40 | 2.02 | 10.09 | 2.52 | 0.46 |
| 9 | 26.48 | 50.89 | 4.84 | 3.27 | 1.94 | 9.71 | 2.43 | 0.44 |
| 10 | 26.76 | 49.02 | 4.08 | 3.15 | 1.87 | 9.35 | 2.34 | 0.43 |
| 11 | 32.81 | 47.29 | 3.37 | 3.04 | 1.80 | 9.02 | 2.26 | 0.41 |
| 12 | 34.26 | 46.47 | 3.03 | 2.98 | 1.77 | 8.87 | 2.22 | 0.40 |
| 13 | 35.65 | 45.68 | 2.71 | 2.93 | 1.74 | 8.72 | 2.18 | 0.40 |
| 14 | 37.00 | 44.91 | 2.39 | 2.88 | 1.71 | 8.57 | 2.14 | 0.39 |
| 15 | 38.31 | 44.17 | 2.09 | 2.83 | 1.69 | 8.43 | 2.11 | 0.38 |
| 16 | 47.18 | 39.14 | 0 | 2.51 | 1.49 | 7.47 | 1.87 | 0.34 |

Graded Formulations

| TiBor3 Layer | TiBor/Steel | TiBor | Steel |
|---|---|---|---|
| 3 | 1 | 75 | 10 |
| 3 | 2 | 50 | 50 |
| 3 | 3 | 75 | 25 |
| 3 |   | 100 | 0 |
| 4 |   | 100 | 0 |
| 5 |   | 100 | 0 |

Table 3 expands the TiBor formulation to include B, Si, Cr, Fe, and C. The graded layer or functionally gradient structure is formed as described for TiBor 1 formulation.

The composition of the TiBor materials or powders are pyrophoric, and, thus, being pyrotechnic heat sources, produce a large amount of heat and, typically, with little or no gases, are slow burning. The inherent heat from the pyrotechnic action may cause the formation and growth reaction or reactions to produce the TiB whiskers reinforcing the matrix.

The compositions are ideal since pyrotechnic compositions are usually homogenized mixtures of small particles of fuels and oxidizers. The particles may be grains or flakes. Generally, the higher the surface area of the particles, the higher the reaction rate and burning speed. In fact, the Ti+B forms a pyrotechnic mixture, and it is one of the hottest pyrotechnic reactions available with the advantage of being a solid state gasless reaction. There must be ignition of the Ti—B mixture to get results. Ignition may be accomplished by a number of means, such as adding a blend of $TiH_2$—$KClO_4$ or $TiH_2$—$NH_4ClO_4$, which must be ignited by some method like a 1 ohm bridge wire. The combustion flame spraying should also act as an igniter, in the thermal spray process, as well as the welding overlay process or post-flame treatment process.

In the present disclosure, densification aids, diffusional aids, and flux agents are defined in the following manner:
Densification aids typically have a melting point below the process temperatures used for whisker growth. Densification aids are Fe, Mo, or Fe alloys such as Fe—Mo.
Diffusional aids increase the mobility and diffusion of reactive atoms or molecules. Diffusional aids include $CaCO_3$, $CaF_2$, $NaHCO_3$, $KBF_4$, etc.
Fluxing agents, such as $CaF_2$, Si, and B, protect the powders from oxidation and promote homogenous melting.

However, a "pyrotechnic composition" may be added to produce a significant amount of heat or hot particles causing heating of target material. The pyrotechnic composition contains a fuel and an oxidizer. The pyrotechnic mixtures are homogenized compositions of small particles of fuels and oxidizers.

There are a large number of pyrotechnic compositions that could be used in the present case:
Zr and $NH_4ClO_4$
Zr and $KClO_4$
B and $KNO_3$
Al and $NH_4ClO_4$
Al and $KClO_4$
Ti and $NH_4ClO_4$
Ti and $KClO_4$
Ti—Al and $NH_4ClO_4$
Ti—Al and $KClO_4$
$ZrH_2$, $TiH_2$, or BH and
$NH_4ClO_4$ or $KClO_4$
Ti and B (note the pyrotechnic composition)
There are many other examples of pyrotechnic compositions, including:
Fuels: metals, metal hydrides, metal carbides, non-metallic inorganics, carbon materials, and organics;
Oxidizers: perchlorates, chlorates, nitrates, permanganates, chromates, oxides, peroxides, sulfates, organics, etc.; and
Additives (each has a specific function): catalysts, stabilizers, binders, etc.

Although the present disclosure has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present disclosure, are contemplated thereby, and are intended to be covered by the following claims.

What is claimed is:

1. A method for surface treating a metal alloy substrate or other material substrate to provide improved wear and corrosion resistance for a resulting composite structure, comprising:
depositing a layer of titanium and boron on a surface of the substrate in the presence of sufficient deposition process heat such that diffusion interactions occur and the titanium and boron react to form elongate titanium monoboride structures in a matrix, wherein the titanium and boron partially diffuse into the surface of the substrate to form a reinforced material intermingled with the surface of the substrate to provide the composite structure;
wherein one or more of the titanium and boron are deposited at a temperature of about 800 degrees C. or more.

2. The surface treatment method of claim 1, wherein the boron is deposited as titanium diboride.

3. The surface treatment method of claim 1, wherein the matrix comprises titanium.

4. The surface treatment method of claim 1, wherein the matrix comprises β-titanium.

5. The surface treatment method of claim 1, wherein the titanium and boron are deposited via one of a thermal spraying and physical vapor deposition technique.

6. The surface treatment method of claim 1, wherein one or more of the titanium and boron are deposited in a substantially melted state.

7. The surface treatment method of claim 1, wherein the layer of titanium and boron further comprises a fluxing agent selected from the group consisting of $CaF_2$, Si, and B.

8. The surface treatment method of claim 1, wherein the layer of titanium and boron further comprises a beta stabilizer selected from the group consisting of molybdenum, vanadium, tantalum, niobium, manganese, iron, chromium, cobalt, nickel, copper, and silicon.

9. The surface treatment method of claim 1, wherein the layer of titanium and boron further comprises a densification aid selected from the group consisting of Fe, Mo, and an Fe alloy.

10. The surface treatment method of claim 1, wherein the layer of titanium and boron further comprises a diffusional aid selected from the group consisting of $CaCO_3$, $CaF_2$, $NaHCO_3$, and $KBF_4$.

11. The surface treatment method of claim 1, wherein the layer of titanium and boron comprises a plurality of particle sizes to aid diffusion interactions.

12. The surface treatment method of claim 1, wherein the layer of titanium and boron is deposited on the substrate in a functionally gradient manner via one of a thermal spraying and physical vapor deposition technique.

13. The surface treatment method of claim 1, wherein the layer of titanium and boron is subjected to heat treatment subsequent to deposition on the substrate.

14. A method for surface treating a metal alloy substrate or other material substrate to provide improved wear and corrosion resistance for a resulting composite structure, comprising:
  depositing a layer of titanium and boron on a surface of the substrate in the presence of sufficient deposition process heat such that diffusion interactions occur and the titanium and boron react to form elongate titanium monoboride structures in a matrix, wherein the titanium and boron partially diffuse into the surface of the substrate to form a reinforced material intermingled with the surface of the substrate to provide the composite structure;
  wherein one or more of the titanium and boron are deposited at a temperature of about 800 degrees C. or more; and
  subsequently heat treating the layer of titanium and boron.

* * * * *